(12) United States Patent
Uchikoba

(10) Patent No.: US 7,743,493 B2
(45) Date of Patent: Jun. 29, 2010

(54) METHOD FOR MANUFACTURING A CERAMIC ELECTRONIC COMPONENT

(75) Inventor: Fumio Uchikoba, Tokyo (JP)

(73) Assignee: Nihon University, Tokyo (JP)

( * ) Notice: Subject to any disclaimer, the term of this patent is extended or adjusted under 35 U.S.C. 154(b) by 43 days.

(21) Appl. No.: 11/573,691

(22) PCT Filed: Sep. 22, 2005

(86) PCT No.: PCT/JP2005/017505

§ 371 (c)(1),
(2), (4) Date: Feb. 14, 2007

(87) PCT Pub. No.: WO2006/033402

PCT Pub. Date: Mar. 30, 2006

(65) Prior Publication Data

US 2007/0245555 A1     Oct. 25, 2007

(30) Foreign Application Priority Data

Sep. 24, 2004   (JP)   ............................. 2004-276818

(51) Int. Cl.
| | |
|---|---|
| H05K 3/02 | (2006.01) |
| H05K 3/10 | (2006.01) |
| H05K 3/20 | (2006.01) |
| B05D 5/12 | (2006.01) |
| B28B 19/00 | (2006.01) |
| B29B 15/10 | (2006.01) |
| C23C 18/00 | (2006.01) |
| C23C 20/00 | (2006.01) |
| C23C 24/00 | (2006.01) |
| C23C 28/00 | (2006.01) |
| C23C 30/00 | (2006.01) |
| H01C 17/06 | (2006.01) |
| H05K 3/00 | (2006.01) |

(52) U.S. Cl. ............... 29/846; 29/831; 427/96.1; 427/98.4; 427/100; 427/117; 427/123; 427/126.1

(58) Field of Classification Search ............ 29/25.35, 29/846, 831; 427/96.1, 98.4, 100, 117, 123, 427/126.1, 143, 146
See application file for complete search history.

(56) References Cited

U.S. PATENT DOCUMENTS

| | | | | |
|---|---|---|---|---|
| 5,759,737 A | * | 6/1998 | Feilchenfeld et al. | ....... 430/311 |
| 6,074,893 A | * | 6/2000 | Nakata et al. | ............... 438/106 |
| 6,411,012 B2 | * | 6/2002 | Furukawa et al. | ........... 310/328 |

(Continued)

FOREIGN PATENT DOCUMENTS

JP     05-62948 A     3/1993

(Continued)

*Primary Examiner*—A. Dexter Tugbang
*Assistant Examiner*—David P Angwin
(74) *Attorney, Agent, or Firm*—Pearne & Gordon LLP

(57) ABSTRACT

A photo-resist of a dry film patterned to form opening portions and non-opening portions is provided on a release film. An electrically conductive paste is applied by a doctor blade and thereafter is dried. Then, the release film of the dry film is removed and thereafter the dry film is adhered to a ceramic green sheet. The photo-resist is removed from the ceramic green sheet to form an electrically conductive film on the ceramic green sheet. The ceramic electronic component is manufactured by sintering the ceramic green sheet having the electrically conductive film formed.

16 Claims, 5 Drawing Sheets

U.S. PATENT DOCUMENTS

| | | | |
|---|---|---|---|
| 6,770,412 B2 * | 8/2004 | Gray et al. | 430/264 |
| 7,402,220 B2 * | 7/2008 | Murosawa et al. | 156/89.12 |
| 7,414,823 B2 * | 8/2008 | Hashikura et al. | 361/234 |
| 2004/0000049 A1 * | 1/2004 | McCollum et al. | 29/852 |
| 2005/0057906 A1 * | 3/2005 | Nakatani et al. | 361/771 |

FOREIGN PATENT DOCUMENTS

| | | |
|---|---|---|
| JP | 2000-164459 A | 6/2000 |
| JP | 2004-160773 A | 6/2004 |

* cited by examiner (a)

(b)

(c)

(d)

(e)

(f)

(a)

(b)

(c)

(d)

(e)

(f)

(a)

(b)

(a)

(b)

(c)

(a)

(b)

(c)

(d)

METHOD FOR MANUFACTURING A
CERAMIC ELECTRONIC COMPONENT

TECHNICAL FIELD

This invention relates to a method for manufacturing a ceramic electronic component such as a printed circuit board, a capacitor, a resistor and an inductance and more particularly to a method for manufacturing a ceramic electronic component in which an electrically conductive film corresponding to an electrical conductor pattern of wiring, electrodes and others for the electronic component is formed on a ceramic green sheet by thick film processing.

BACKGROUND OF TECHNOLOGY

In a prior art, there has been used a screen printing method to form an electrically conductive paste film corresponding to the electrical conductor pattern for the electronic component on the ceramic green sheet by the thick film processing (see the patent document 1).

FIG. 4 shows the method for forming the electrically conductive paste film corresponding to the electrical conductor pattern for the electronic components on the ceramic green sheet by the thick film processing according to the prior art. This method will be described in details with reference to FIG. 4 hereinafter.

In this prior art, a mesh-like screen 62 patterned corresponding to an electrical conductor pattern is superposed on a ceramic green sheet 61 as shown in FIG. 4(a) and thereafter an electrically conductive paste 63 is coated on the screen 62 by a squeegee 64 as shown in FIG. 4(b). In FIG. 4(a), a reference numeral 621 designates a non-opening portion of the screen 62 and a reference numeral 622 designates an opening portion of the screen 62. In FIG. 4(b), a reference numeral 631 designates an electrically conductive paste film formed by being filled in the opening portion 622 of the screen 62.

After the electrically conductive paste 63 is coated, the screen 62 is removed out of the ceramic green sheet 61 as shown in FIG. 4(c), so that the electrically conductive paste film 631 is left on the ceramic green sheet 61. The ceramic green sheet 61 and the electrically conductive paste film 631 are sintered after dried to form a ceramic electronic component.

Since the method for manufacturing the electronic component according to the prior art uses the mesh for the screen 62, it is difficult to reduce the width of the electrically conductive film due to the relation of the wire diameter of the mesh. As noted from FIG. 4(d), the electrically conductive paste film 631 of non-dried layer not solidified flows so that its skirt is expanded when the screen 62 is removed out of the ceramic green sheet 61. Thus, the electrically conductive paste film 631 has the width widened and in addition thereto, the cross section thereof gets roundish so that its rectangular shape collapses as shown in FIG. 4(d).

Of late, there has been a large demand of an electrical conductor pattern of high fineness and high density for a ceramic electronic component and a multi-layering of the component has been progressing. The conventional method for manufacturing the ceramic electronic component according to the prior thick film processing cannot disadvantageously meet these demands.

Meantime, an electrically conductive film for a semiconductor IC or the like has been formed by a lift-off method, which is one of thin film processing such as vapor deposition, sputtering and so on (see Patent Document No. 2).

A method of forming the electrically conductive thin film by the lift-off method of the prior art is shown in FIG. 5 and will be explained with reference to FIG. 5. After a photo-resist 72 is coated on a substrate 71 as shown in FIG. 5(a), the photo-resist 72 is patterned corresponding to an electrically conductive pattern by a photolithography method to form opening portions 721 and non-opening portions 722.

Thereafter, vapor particles or ion particles of electrically conductive materials are radiated onto the substrate 71 in the direction indicated by arrows by means of vapor deposition, sputtering, CVD (chemical vapor deposition) and so on. The particles of the electrically conductive materials are stuck and deposited onto the substrate 71 by the radiation energy to form the electrically conductive film 73 as shown in FIG. 5(b). The electrically conductive film portions deposited on the opening portions 721 are designated by a reference numeral 731, those deposited on the non-opening portions 722. are designated by a reference number 732 and those deposited on the side face of the non-opening portions 722. are designated by a reference number 733.

Then, the electrically conductive layer 73 is lightly etched to remove the electrically conductive film 733 deposited on the side face of the non-opening portions 722 as shown in FIG. 5(c) whereby the electrically conductive films 731 and 732 are separated from each other. Finally, the photo-resist 72 and the electrically conductive film 732 on the photo-resist 72 are removed whereby just the electrically conductive film 731 is left on the substrate 71 as shown in FIG. 5(d).

The method of forming the electrically conductive film by this lift-off method can obtain the highly fine and dense electrically conductor patterns because the electrically conductive thin film can be formed. However, since the electrically conductive film is formed by sticking and depositing the vapor particles or the ionic particles of electrically conductive materials onto the substrate, the electrically conductive thick films cannot be formed and the lift-off method cannot disadvantageously form the electronic component of multi-layer construction by laminating a number of substrates having the electrically conductive films provided thereon. Furthermore, since the lift-off method forms the electrically conductive films by the vapor deposition and so on, the steps and the apparatus for forming the electrically conductive films are disadvantageously complicated.

Patent Document 1: JP08-118467 A1
Patent Document 2: JP05-62948 A1

DISCLOSURE OF THE INVENTION

An object of the invention is to provide a method for manufacturing a ceramic electronic component adapted to enable an electrically conductor pattern to have a high fineness and a high density and also to have a multi-layer.

In a fundamental form, the invention provides a method for manufacturing a ceramic electronic component comprising the steps of forming onto a ceramic green sheet an electrically conductive film corresponding to an electrically conductive pattern of the electronic component; and thereafter sintering the ceramic green sheet and the electrically conductive film to manufacture the electronic component, characterized by comprising the steps of patterning a photo-resist of a dry film corresponding to the electrically conductive pattern of the electronic component; applying an electrically conductive paste on the patterned photo-resist before or after the dry film is adhered to the ceramic green sheet; and drying and solidifying the electrically conductive paste to form the electrically conductive film on the ceramic green sheet.

In a concrete first form, the invention provides a method for manufacturing a ceramic electronic component comprising the steps of forming onto a ceramic green sheet an electrically conductive film corresponding to an electrically conductive pattern of the electronic component; and thereafter sintering the ceramic green sheet and the electrically conductive film to form the electronic component, characterized by comprising the steps of patterning a photo-resist of a dry film including the photo-resist and a release film corresponding to the electrically conductive pattern of the electronic component; thereafter applying an electrically conductive paste on the patterned photo-resist and drying the electrically conductive paste; removing the release film from the photo-resist of the dry film; adhering the photo-resist of the dry film having the release film removed to the ceramic green sheet; and removing the photo-resist of the dry film from the ceramic green sheet to form the electrically conductive film on the ceramic green sheet.

In a second concrete form, the invention provides a method for manufacturing a ceramic electronic component comprising the steps of forming onto a ceramic green sheet an electrically conductive film corresponding to an electrically conductive pattern of the electronic component; and thereafter sintering the ceramic green sheet and the electrically conductive film to manufacture the electronic component, characterized by comprising the steps of patterning a photo-resist of a dry film including the photo-resist and a release film corresponding to the electrically conductive pattern of the electronic component; removing the release film from the patterned photo-resist of the dry film; removing the release film from the patterned photo-resist; adhering to the ceramic green sheet the photo-resist of the dry film having the release film removed; thereafter applying an electrically conductive paste on the photo-resist of the dry film and then drying the electrically conductive paste; thereafter removing the photo-resist of the dry film from the ceramic green sheet to form the electrically conductive film on the ceramic green sheet.

EFFECT OF THE INVENTION

In accordance with the invention, since the dry film is used instead of the screen used for forming the electrically conductive film of the prior art whereby the electrically conductive film is formed on the ceramic green sheet, the electrically conductive thick film can be formed in the same manner as performed by the screen printing method and in addition thereto, the electrically conductive film of high fineness and high density can be formed in the state closer to that formed by the lift-off method. Thus, there can be obtained the ceramic electronic component having the electrically conductive thick film of high fineness and high density.

Furthermore, in accordance with the invention, since the electrically conductive film of high fineness and high density can be formed on the ceramic green sheet by a simple operation of applying the electrically conductive paste on the dry film, drying it and removing the photo-resist of the dry film from the ceramic green sheet, the steps and the apparatus of forming the electrically conductive thick film can be simplified.

In accordance with the invention, since the film thickness of the electrically conductive film can change by changing the film thickness of the dry film, the film thickness of the electrically conductive film can be easily set.

In accordance with the invention, since the boundary portion between the electrically conductive film portions filled in and formed on the opening portions of the photo-resist of the dry film and the electrically conductive film portions formed on the non-opening portions of the photo-resist of the dry film is thinned because the electrically conductive film portions formed on the opening portions of the photo-resist of the dry film has the bulk reduced when the electrically conductive paste applied on the dry film is dried, the adjacent electrically conductive film portions at the boundary portions can be easily separated by the thinned portions.

Since the photo-resist of the dry film is removed from the ceramic green sheet after the electrically conductive paste filled in the opening portions of the photo-resist of the dry film is dried and solidified, the shape of the cross section of the electrically conductive film never collapses whereby the predetermined shape of the cross section thereof can be kept.

In accordance with the invention, since the dry film, which is still prepared separately from the ceramic green sheet before the dry film is adhered to the ceramic green, is patterned, the patterning operation can be successively and easily performed. Furthermore, since the electrically conductive paste is applied on the dry film prepared separately from the ceramic green sheet, the applying operation can be successively and simply performed. Even though the application of the electrically conductive paste is unsuccessfully performed, the ceramic green sheet never gets wasteful.

BEST MODE OF EMBODIMENT OF INVENTION

Figure 1:
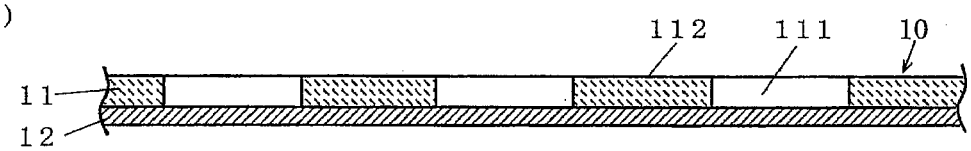
FIG. 1 illustrates in cross section the successive steps of forming an electrically conductive film on a ceramic green sheet for manufacturing a ceramic electronic component in accordance with a first form of embodiment of the invention.
Figure 1:
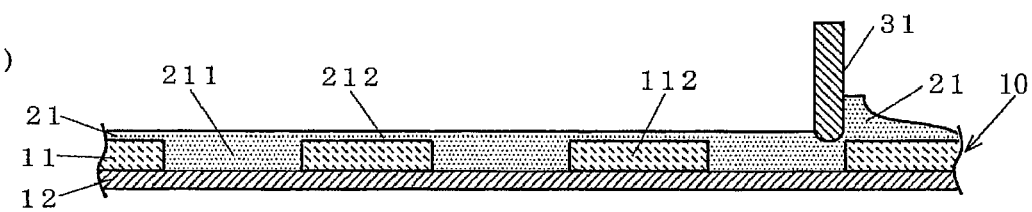
Figure 1:
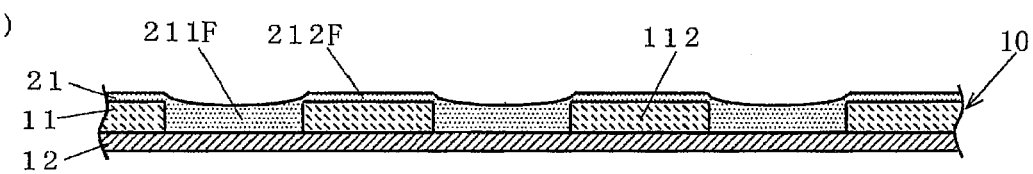
Figure 1:
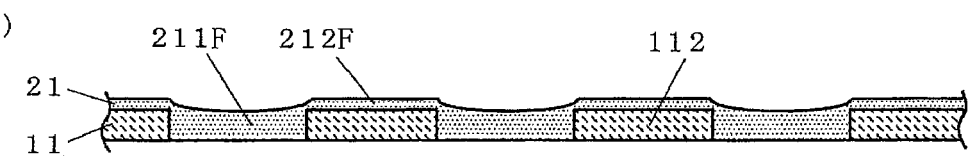
Figure 1:
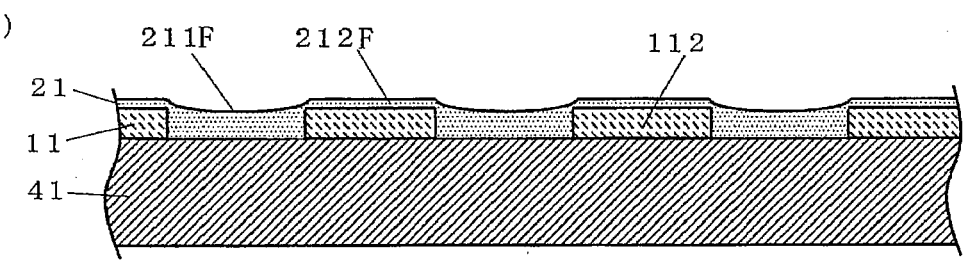
Figure 1:
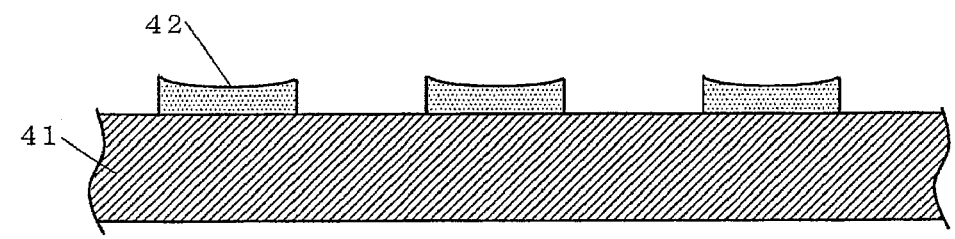
Figure 2:
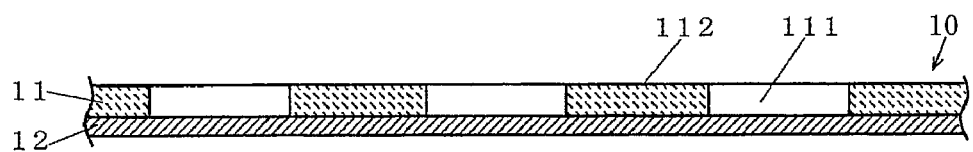
FIG. 2 illustrates in cross section the successive steps of forming an electrically conductive film on a ceramic green sheet for manufacturing a ceramic electronic component in accordance with a second form of embodiment of the invention.
Figure 2:
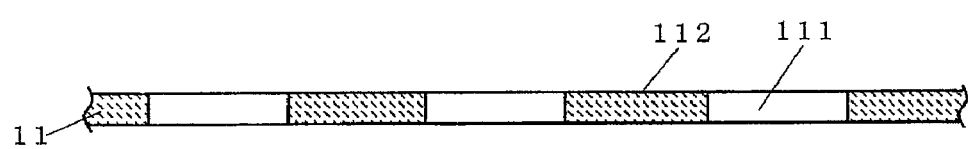
Figure 2:
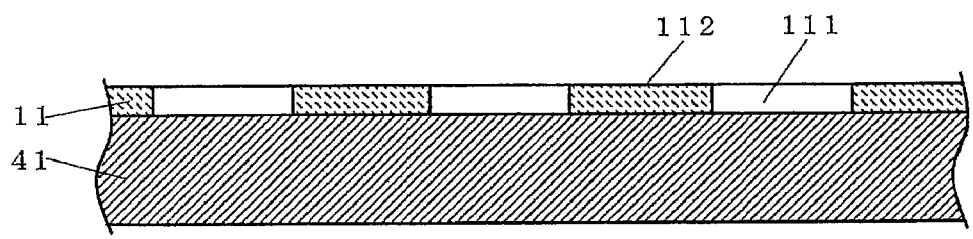
Figure 2:
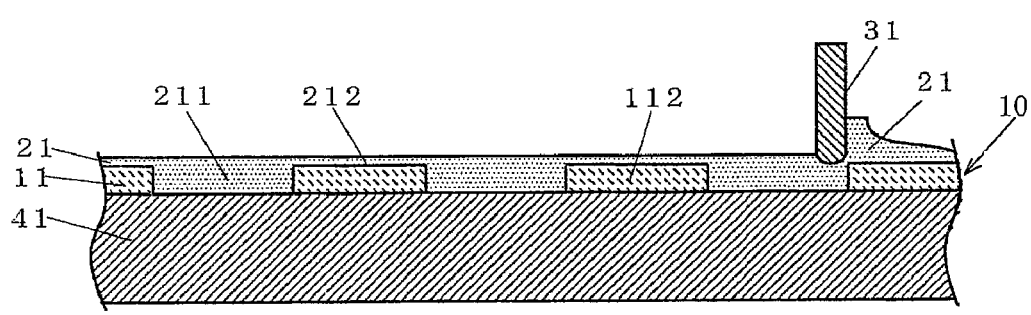
Figure 2:
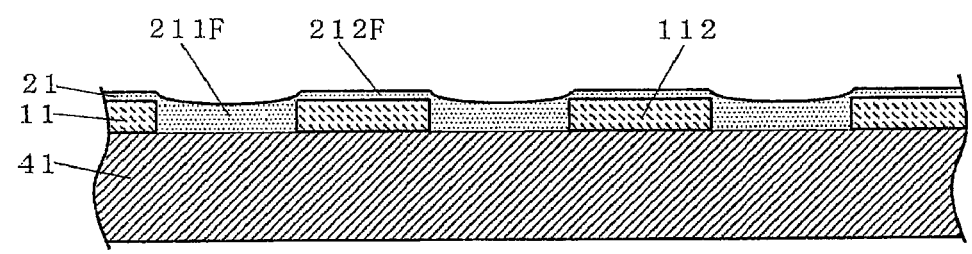
Figure 2:
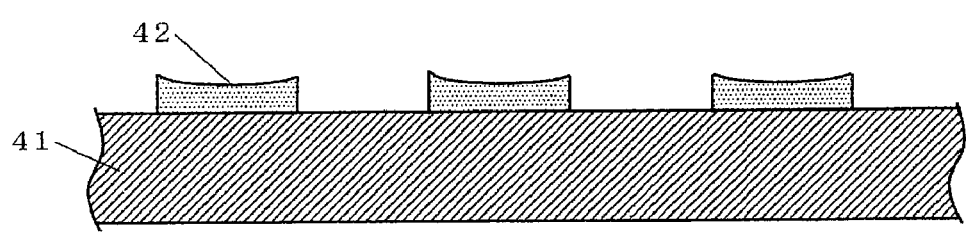

FIGS. 1 and 2 illustrate a method for manufacturing a ceramic electronic component in accordance with a first form of embodiment and a second form of embodiment of the invention, respectively. In either of the forms of embodiment, an electrically conductive film 42 corresponding to an electrically conductive pattern of the electronic component is formed on a ceramic green sheet 41 and thereafter the ceramic green sheet 41 and the electrically conductive film 42 are sintered to thereby manufacture the ceramic electronic component (see FIG. 1(*f*) and FIG. 2(*f*)). The forms of embodiment are common in that the electrically conductive film 42 is formed by patterning a photo-resist 11 of a dry film 10 including a release film (carrier film) 12 and the photo-resist 11 provided on the release film 12 corresponding to the electrically conductive pattern of the electronic component and applying an electrically conductive paste 21 on the patterned photo-resist 11.

One formed by combining alumina core material and glass powder with each other, bonding them by a butyral binder, deforming them into a tape and baking it in a low temperature may be used as the ceramic green sheet, but otherwise, there may be used one including barium titanate used for condensers and so on, ferrite used for inductors, high frequency dielectrics used for high frequency circuits.

A commercially available acryl photo-sensitive sheet may be used for the dry film 10. The electrically conductive paste 21 may be formed by binding electrically conductive particles of material such as silver, copper or nickel having a particle diameter of 0.05 to 10 μm, preferably 0.1 to 2 μm with a binder of polyvinyl butyral (PVB), ethyl cellulose, acryl resin and so on. The blend ratio of the electrically conductive particles and the binder is 3 to 10, preferably 5 to 7 of the binder relative to 100 of the electrically conductive particles by weight. The viscosity of the electrically conductive particles may be 0.1 Pa·s to 10 Pa·s, preferably 0.5 Pa·s to 1 Pa·s in case of being applied by the doctor blade, but may be 1 Pa·s to 100 Pa·s, preferably 10 Pa·s to 50 Pa·s in case of being applied by the screen. If the viscosity of the electrically conductive particles is lower than 0.1 Pa·s (the application by the doctor blade) or 1 Pa·s (the application by the screen), then there will occur a blot in an interface between the release film (PET film) 12 and the dry film 10 (in a first form of embodiment described later) or in an interface between the dry film 10 and the ceramic green sheet 42 (in a second form of embodiment described later) and the electrically conductive pattern will be deformed when the dry film 10 is removed. If the viscosity of the electrically conductive particles is higher than 10 Pa·s (the application by the doctor blade) or 100 Pa·s (the application by the screen), then there will occur a problem such as the electrically conductive pattern thinned or interrupted due to no progress of the filling of the electrically conductive paste.

The details of some forms of embodiment of the invention will be described with reference to FIGS. 1 and 2, respectively.

In the first form of embodiment, as shown in FIG. 1(a), the photo-resist 11 of the dry film 10 is patterned according to the electrically conductive pattern of the electronic component (device) to form opening portions 111 and non-opening portions 112. The pattern of the opening portions 111 and the non-opening portions 112 of the photo-resist 11 may be formed by exposing and developing the photo-resist 11 by using a not shown photo mask prepared according to the electrically conductive pattern of the wiring, the electrodes and so on of the electronic component.

Thereafter, as shown in FIG. 1(b), the electrically conductive paste 21 is applied on the dry film 10 by using the doctor blade 31. In FIG. 1(b), the electrically conductive paste filled in the opening portions 111 of the photo-resist 11 of the dry film 10 is designated by a reference numeral 211 while the electrically conductive paste applied on the surface of the non-opening portions 112 of the photo-resist 11 is designated by a reference numeral 212.

After the electrically conductive paste 21 is applied on the dry film 10, the electrically conductive paste 21 is dried. The drying operation may be conducted following the application of the electrically conductive paste 21 on a hot plate. In this case, the hot plate may be maintained at a temperature of 40° C. to 70° C., preferably 50° C. to 60° C. and this temperature is kept until the paste is dried after its application. The time required until it is dried may be about 20 minutes. The dry film 10 having the electrically conductive paste 21 applied thereon may be dried while it is contained in a drying machine having the temperature of 50° C. to 80° C. maintained and in this case, the drying time is about 20 minutes to 60 minutes.

As the electrically conductive paste 21 applied on the dry film 10 is dried in this manner, an electrically conductive film is formed. On this drying, a height (level) of the electrically conductive film portion 211F formed by the electrically conductive paste 211 is settled while the middle portion thereof is somewhat lowered. More particularly, although the electrically conductive paste 211 is fulfilled in the opening portions 111 of the photo-resist 11 immediately after it is filled in the opening portions 111, but the opening portions 111 have fine gaps existing therein due to air or the like remaining in the opening portions 111. Since these gaps disappear with time and the paste is dried, the electrically conductive film portion 211F corresponding to the electrically conductive paste 211 has the height somewhat reduced and settled. As this result, the electrically conductive film portion 211F corresponding to the electrically conductive paste 211 has the middle portion somewhat lowered as shown in FIG. 1(c).

After the electrically conductive paste 21 is dried in this manner, the release film 12 is removed from the dry film 10 as shown in FIG. 1(d). The dry film 10 having the release film 12 removed is pressed and adhered to the ceramic green sheet 41 as shown in FIG. 1(e).

This pressing operation may be conducted by press means such as a uniaxial pressure or pneumatic pressure press or a cold isostatic press using a hydrostatic pressure. In this case, although the dry film 10 together with the electrically conductive film portions 211F (the portions corresponding to the electrically conductive paste 211) may be adhered to the ceramic green sheet 41 by heightening the pressure when pressed without using any heating or solvent, the dry film 10 may be preferably adhered to the ceramic green sheet 41 by restoring the tackiness of the dry film 10 by using the heating and/or the solvent together with the pressing. The heating temperature may be 50° C. to 80° C. and preferably 60° C. to 70° C. and the pressure may be 200 kg/cm² to 1000 kg/cm² and preferably 400 kg/cm² to 500 kg/cm². The solvent used together with the pressing may be toluene, xylene and the mixture solution thereof.

After the dry film 10 having the electrically conductive film is adhered to the ceramic green sheet 41 in this manner, the photo-resist 11 of the dry film 10 is removed (taken off) from the ceramic green sheet 41 and as a result, the electrically conductive film corresponding to the electrically conductive paste 212 attached onto the surface of the non-opening portions 12 of the photo-resist 11 is also removed whereby the electrically conductive film 42 corresponding to the electrically conductive paste 211 is formed on the ceramic green sheet 41 as shown in FIG. 1(f).

As already described, the electrically conductive film portion 211F corresponding to the electrically conductive paste 211 has the height reduced as shown in FIG. 1(e) whereby the portions close to the corners (shoulders) of the non-opening portions 112 of the photo-resist 11 is thinned and therefore the dry film 10 could be more easily removed from the portions corresponding to the electrically conductive paste 212 when the photo-resist 11 of the dry film 10 is removed from the ceramic green sheet 41.

In order to remove the photo-resist 11 of the dry film 10 from the ceramic green sheet 41, the dry film 10 and the ceramic green sheet 41 may be immersed into 1% solution of sodium carbonate or sodium hydroxide to dissolve the photo-resist 11, which enables the photo-resist 11 to be easily removed.

The ceramic green sheet 41 having the electrically conductive film 42 thus formed is sintered to complete the ceramic electronic component. In case that the ceramic electronic component of multi-layer construction such as a multi-layer print circuit board is required, after a plurality of ceramic green sheets shown in FIG. 1(f) are laminated one onto another, the laminate is sintered to produce the ceramic electronic component of multi-layer construction. In this case, the electrically conductive pattern of each layer (each ceramic green sheet 41) may be identical to each other or different from each other.

The film thickness of the electrically conductive film 42 of FIG. 1(f) is determined on the thickness of the corresponding electrically conductive paste 211 and the thickness of the electrically conductive paste is determined on the thickness of the photo-resist 11 of the dry film 10. Thus, the film thickness of the electrically conductive film 42 can vary by changing the thickness of the dry film 10. However, the thickness of the photo-resist 11 may preferably fall within the range of 5 μm to 100 μm. If the thickness of the photo-resist 11 is less than 5 μm, then the strength of the photo-resist 11 is short and if it is higher than 100 μm, then the photo-resist cannot be removed from the ceramic green sheet 41.

In order to apply the electrically conductive paste 21, there may be used a screen of no pattern and a squeegee other than the doctor blade. In this case, the screen is set on the dry film and the electrically conductive paste is applied by the squeegee.

In this first form of embodiment, since the height of the electrically conductive paste 211 is reduced after it is dried, the connection portions of the electrically conductive film portions 211F corresponding to the electrically conductive paste 211 and the electrically conductive film portions 212F corresponding to the electrically conductive paste 212 (the portions adjacent to the corners (shoulders) 113 of the non-opening portions 112 of the photo-resist 11) gets thinner than the electrically conductive film portions 212F. Thus, when the photo-resist 11 of the dry film 10 is removed from the ceramic green sheet 42, the electrically conductive film portions 211F and the electrically conductive film portions 212F can be easily separated from each other at the thinner portions.

Figure 3:
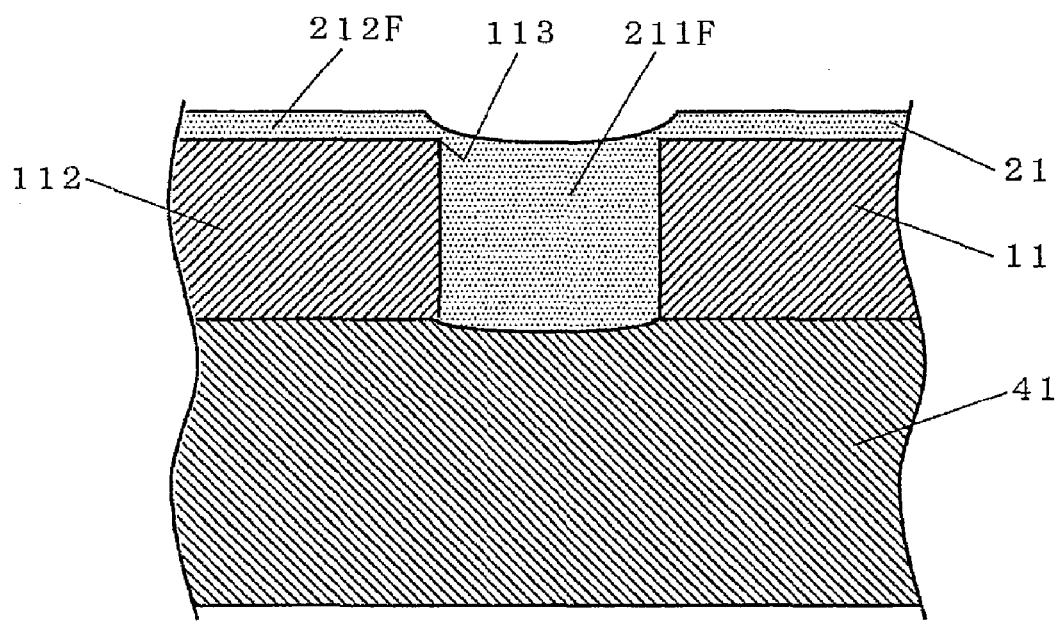
FIG. 3 illustrates in cross section the state where there is reduced a height of the electrically conductive film formed by applying an electrically conductive paste on a dry film and drying and solidifying it by means shown in FIG. 1 or FIG. 2.
Figure 3:
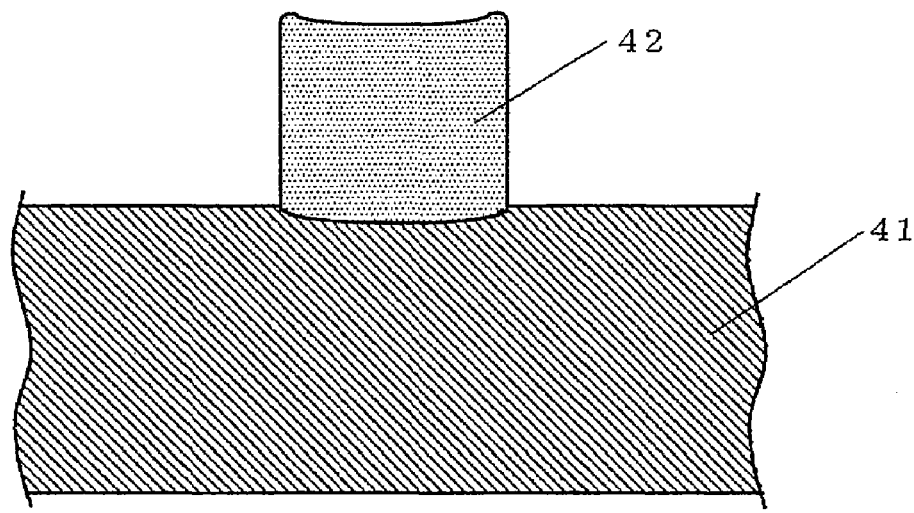
Figure 4:
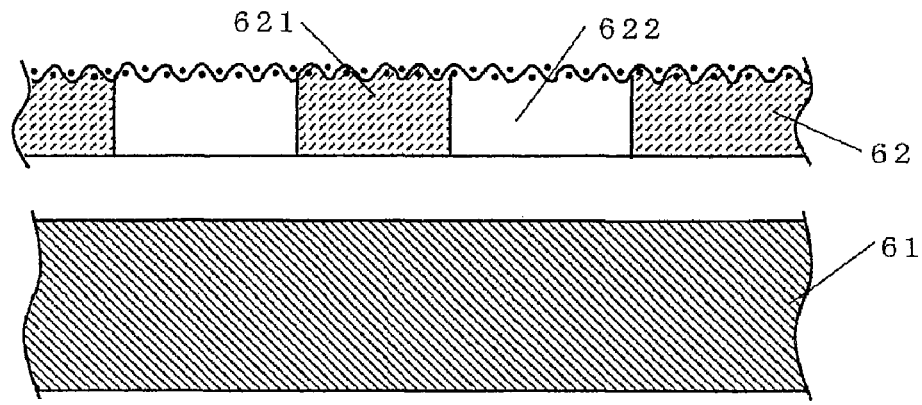
FIG. 4 illustrates in cross section the successive steps of forming an electrically conductive film on a ceramic green sheet by the screen printing method of the prior art.
Figure 4:
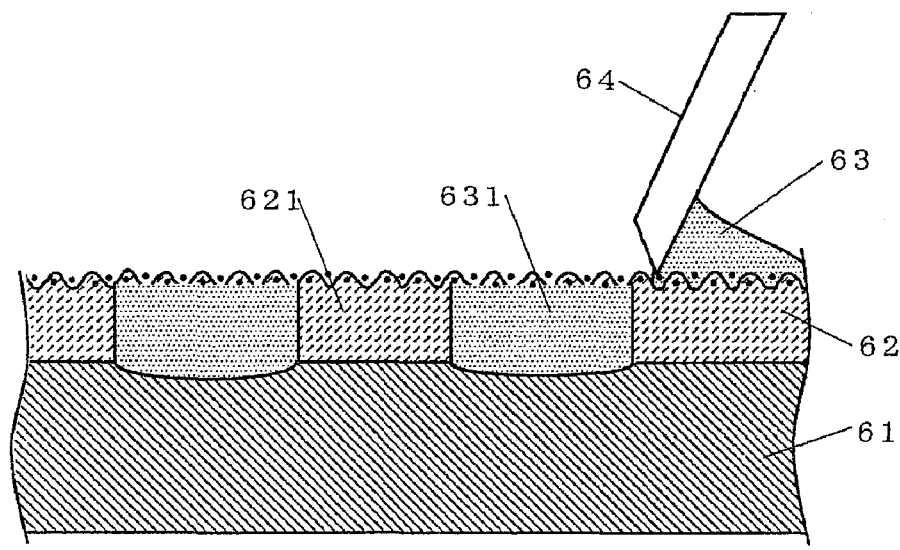
Figure 4:
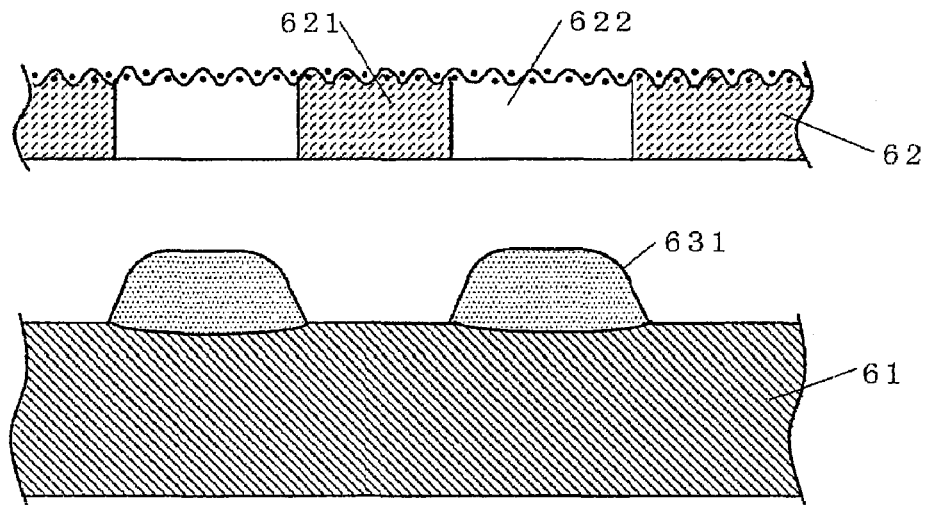
Figure 5:
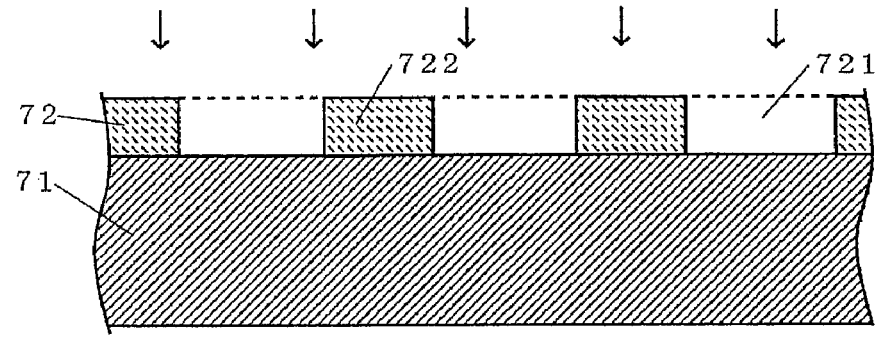
FIG. 5 illustrates in cross section the successive steps of forming an electrically conductive thin film on a substrate by the lift-off method of the prior art.
Figure 5:
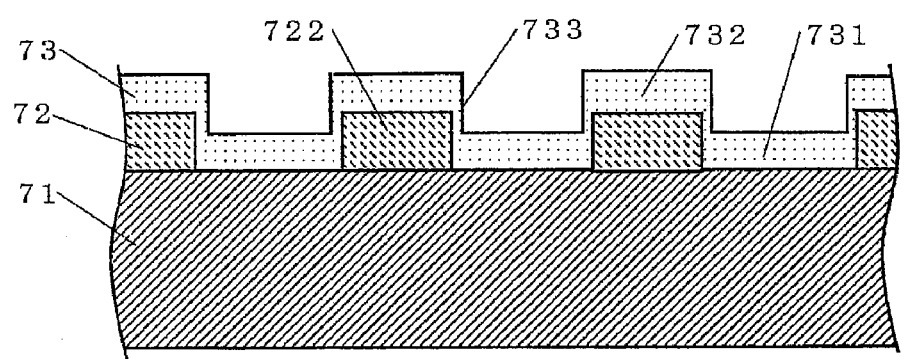
Figure 5:
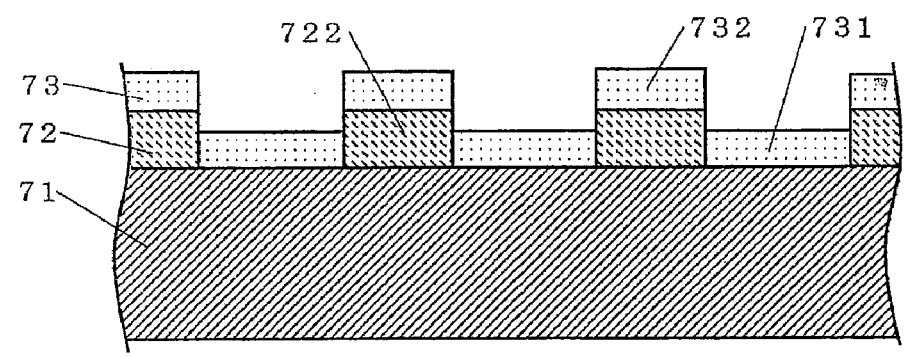
Figure 5:
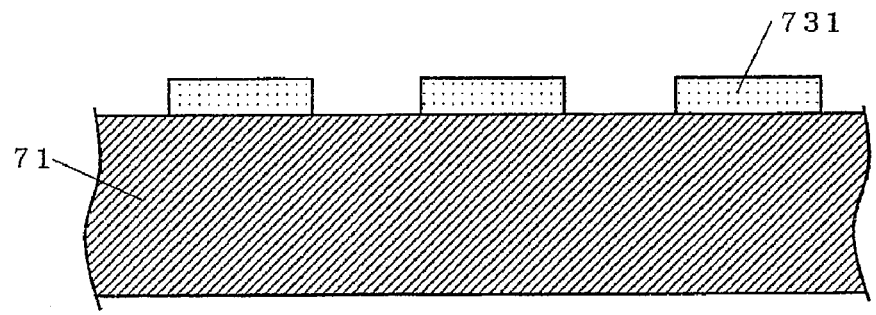

Since the electrically conductive film 42 (the film portion corresponding to the electrically conductive film portions 211F) formed by removing the photo-resist 11 of the dry film 10 from the ceramic green sheet 41 is already dried and solidified, the cross section thereof is maintained in the rectangular or square shape without any collapse as shown in FIG. 3(b)

Furthermore, since there is used the dry film 10 patterned by using the photo mask for forming the electrically conductive film 42, the patterning of the electrically conductive film may be conducted with high fineness and high density. Thus, after the electrically conductive paste 21 is applied on the dry film 10 and is dried, the dry film 10 is adhered to the ceramic green sheet 41 and the dry film 10 is removed from the ceramic green sheet 41 whereby the highly fine and highly dense electrically conductive film can be formed on the ceramic green sheet 41. In this manner, the first form of embodiment has both of characteristics of the thick film technique of the screen printing method and so on and the high fineness and high density techniques by the thin film method of the semiconductor IC and so on by adhering the patterned dry film to the ceramic green sheet.

More particularly, in the first form of embodiment, since the method substantially identical to the lift-off method used for the thin film technique in the technical field, which is wholly different from that of the thick film method can be applied to the thick film method by using the dry film, the electrically conductive thick film having the high fineness and the high density, which are closer to that of the film obtained by the lift-off method can be formed on the ceramic green sheet with the same simplicity as the thick film method of screen printing method and so on and the steps and the apparatus for forming the electrically conductive thick film is simplified.

Also, in the first form of embodiment, since the dry film 10 is patterned before it is adhered to the ceramic green sheet 41, the patterning operation can be easily and successively conducted. In addition thereto, since the electrically conductive paste 21 can be applied on the dry film 10 before it is adhered to the ceramic green sheet 41, it is not required that the screen is mounted on and removed from each sheet of the ceramic green sheets as conducted in the conventional screen printing process. Since the dry film 10 having the electrically conductive paste beforehand applied thereto can be adhered to the ceramic green sheet, the electrically conductive film can be formed by the simple operation. Since the dry film having the electrically conductive paste applied thereto is prepared separately from the ceramic green sheet, the ceramic green sheet never gets wasteful even though the electrically conductive paste fails to be applied.

A second form of embodiment of the invention is shown in FIG. 2 and this form of embodiment may be suitably used for forming the electrically conductive thick film on the ceramic green sheet 41.

In this second form of embodiment, the electrically conductive paste 21 is applied on the dry film 10 after the dry film 10 is adhered to the ceramic green sheet, which is different from the first form of embodiment in which the dry film 10 is adhered to the ceramic green sheet after the electrically conductive paste 21 is applied on the dry film 10. The second form of embodiment is identical to the first form of embodiment except to the order of adhesion of the dry film. The second form of embodiment will be described with reference to FIG. 2.

As shown in FIG. 2(a), the photo-resist 11 of the dry film 10 is patterned to form the opening portions 111 and the non-opening portions 112. This may be conducted in the same manner as the first form of embodiment.

Thereafter, as shown in FIG. 2(b), the release film 12 of the dry film 10 is removed, then as shown in FIG. 2(c), the photo-resist 11 of the dry film 10 is pressed onto and adhered to the ceramic green sheet 41 and after that as shown in FIG. 2(d), the electrically conductive paste 21 is applied on the photo-resist 11 by using the doctor blade 31.

After the electrically conductive paste 21 is applied, as shown in FIG. 2(e), the electrically conductive paste 21 is dried. The portion corresponding to the electrically conductive paste 211 filled in the opening portions 111 of the photo-resist 11 has the height (level) reduced and settled by the dryness in the same manner as the first form of embodiment.

After the electrically conductive paste 21 is dried, as the photo-resist 11 of the dry film 10 is removed from the ceramic green sheet 41, the electrically conductive film portions corresponding to the electrictrically conductive paste 212 adhered to the surface of the non-opening portions 112 of the photo-resist 11 is also removed whereby the electrically conductive film 42 corresponding to the electrically conductive paste 211 is formed on the ceramic green sheet 41 as shown in FIG. 2(f).

The second form of embodiment has the same effect as the first form of embodiment, but since the dry film 10 is adhered to the ceramic green sheet 41 before the electrically conductive paste 21 is applied thereon, which is different from the first form of embodiment, the adhesion operation of the dry film 10 can be easily conducted.

EXAMPLES

Some concrete examples of the invention will be explained hereinafter.

Example 1

In this Example, the ceramic electronic component was manufactured in accordance with the first form of embodiment. The electrically conductive paste 21 was formed of silver particles of a particle diameter of 1.06 μm, polyvinyl butyral (PVB) and toluene. The blend ratio of the silver particles and the polyvinyl butyral was 7 relative to 100 by weight and the viscosity was prepared to be 0.7 Pa·s. A conventional acrylic photo-sensitive sheet of thickness of 50 μm was used for the dry film 41. Both of the width and the space of the electrically conductive film 42 formed in this Example were 100 μm and the film thickness (the thickness of the thinnest portions after dried) was 40 μm.

Example 2

In this Example, the ceramic electronic component was manufactured in accordance with the second form of embodiment. In this Example, for the electrically conductive paste 21 was used the same electrically conductive paste as in the first form of embodiment and for the dry film 41 was used a commercially available acrylic sheet of thickness of 25 μm. Both of the width and the space of the electrically conductive film 42 formed in this Example were 30 μm and the film thickness (the thickness of the thinnest portions after dried) was 20 μm.

Evaluation of Examples 1 and 2

In both of Examples 1 and 2, the electrically conductive films of relatively large film thicknesses of 40 μm and 20 μm could be obtained by using the dry film, but since the width and the space thereof were 100 μm and 30 μm, the electrically conductive film could be formed with high density and high fineness. Since the limit of the thickness of the silicone semiconductor obtained by the lift-off method, which is conventionally used for forming it is generally 1 μm, the electrically conductive thick film of the ceramic electronic component cannot be made tens μm even though it is formed by the lift-off process.

Possibility of Utilization in Industries

According to the invention, since the electrically conductive film is formed on the dry film by applying the electrically conductive paste on the dry film and then drying it before or after the patterned photo-resist of the dry film is adhered to the ceramic green sheet, there can be manufactured the ceramic electronic component having the electrically conductive thick film of high fineness and high density, which improves the utilization in industries.

The invention claimed is:

1. In a method for manufacturing a ceramic electronic component comprising the steps of forming onto a ceramic green sheet an electrically conductive film having an electrically conductive pattern of said electronic component and of thereafter sintering said ceramic green sheet and said electrically conductive film to form said electronic component, the improvement comprising the steps of providing a photo-resist of a dry film carried on a release film; patterning said photo resist to correspond to said electrically conductive pattern of said electronic component; applying an electrically conductive paste on said patterned photo-resist before or after said dry film is adhered to said ceramic green sheet; removing said release film from said photo-resist of said dry film; drying and solidifying said electrically conductive paste to form said electrically conductive film; and removing said photo-resist of said dry film from said ceramic green sheet to form said electrically conductive film on said ceramic green sheet.

2. A method for manufacturing a ceramic electronic component as set forth in claim 1, wherein a thickness of said photo-resist of said dry film is 5 through 100 μm.

3. A method for manufacturing a ceramic electronic component as set forth in claim 1, wherein a viscosity of said electrically conductive paste is 0.1 through 10 Pa·s in case of applying said electrically conductive paste by a doctor blade and 1 through 100 Pa·s in case of applying said electrically conductive paste by a screen.

4. A method for manufacturing a ceramic electronic component as set forth in claim 3, wherein a viscosity of said electrically conductive paste is 0.5 through 1 Pa·s in case of applying said electrically conductive paste by a doctor blade and 10 through 50 Pa·s in case of applying said electrically conductive paste by a screen.

5. A method for manufacturing a ceramic electronic component as set forth in claim 2, wherein a viscosity of said electrically conductive paste is 0.1 through 10 Pa·s in case of applying said electrically conductive paste by a doctor blade and 1 through 100 Pa·s in case of applying said electrically conductive paste by a screen.

6. A method for manufacturing a ceramic electronic component as set forth in claim 5, wherein a viscosity of said electrically conductive paste is 0.5 through 1 Pa·s in case of applying said electrically conductive paste by a doctor blade and 10 through 50 Pa·s in case of applying said electrically conductive paste by a screen.

7. A method of manufacturing a ceramic electronic component as set forth in claim 1, wherein patterning said photo-resist includes forming spaced non-open. portions defining open portions for receipt of said electrically conductive paste to form said electrically conductive film, adjacent non-open portions including corners on opposite sides of an intermediate open portion, applying said electrically conductive paste on said patterned photo-resist includes applying said electrically conductive paste at a level or height that fills said open portion and extends slightly above said adjacent non-open portions, drying and solidifying said electrically conductive paste includes forming applied paste portions on said non-open portions connected to paste within said open portion and settling said applied paste within said open portion to reduce said level or height and thereby form thinner portions of said electrically conductive paste at said corners.

8. A method for manufacturing a ceramic electronic component as set forth in claim 1, wherein said step of applying said electrically conductive paste on said patterned photo-resist is performed before said dry film is adhered to said ceramic green sheet.

9. A method for manufacturing a ceramic electronic component as set forth in claim 1, wherein said step of applying said electrically conductive paste on said patterned photo-resist is performed after said dry film is adhered to said ceramic green sheet.

10. A method for manufacturing a ceramic electronic component as set forth in claim 8, wherein a thickness of said photo-resist of said dry film is 5 through 100 μm.

11. A method for manufacturing a ceramic electronic component as set forth in claim 9, wherein a thickness of said photo-resist of said dry film is 5 through 100 μm.

12. A method for manufacturing a ceramic electronic component as set forth in claim 8, wherein a viscosity of said electrically conductive paste is 0.1 through 10 Pa·s in case of applying said electrically conductive paste by a doctor blade and 1 through 100 Pa·s in case of applying said electrically conductive paste by a screen.

13. A method for manufacturing a ceramic electronic component as set forth in claim 9, wherein a viscosity of said electrically conductive paste is 0.1 through 10 Pa·s in case of applying said electrically conductive paste by a doctor blade and 1 through 100 Pa·s in case of applying said electrically conductive paste by a screen.

14. A method for manufacturing a ceramic electronic component as set forth in claim 12, wherein a viscosity of said electrically conductive paste is 0.5 through 1 Pa·s in case of applying said electrically conductive paste by a doctor blade and 10 through 50 Pa·s in case of applying said electrically conductive paste by a screen.

15. A method for manufacturing a ceramic electronic component as set forth in claim 13, wherein a viscosity of said electrically conductive paste is 0.5 through 1 Pa·s in case of applying said electrically conductive paste by a doctor blade and 10 through 50 Pa·s in case of applying said electrically conductive paste by a screen.

16. A method of manufacturing a ceramic electronic component as set forth in claim 8, wherein patterning said photo-resist includes forming spaced non-open portions defining open portions for receipt of said electrically conductive paste to form said electrically conductive film, adjacent non-open portions including corners on opposite sides of an intermediate open portion, applying said electrically conductive paste on said patterned photo-resist includes applying said electrically conductive paste at a level or height that fills said open portion and extends slightly above said adjacent non-open portions, drying and solidifying said electrically conductive paste includes forming applied paste portions on said non-open portions connected to paste within said open portion and settling said applied paste within said open portion to reduce said level or height and thereby form thinner portions of said electrically conductive paste at said corners.

* * * * *